(12) United States Patent
Schrödinger et al.

(10) Patent No.: US 6,956,408 B2
(45) Date of Patent: Oct. 18, 2005

(54) DRIVE DEVICE FOR A LIGHT-EMITTING COMPONENT

(75) Inventors: Karl Schrödinger, Berlin (DE); Jürgen Blank, Dusseldorf (DE)

(73) Assignee: Infineon Technologies AG, Munich (DE)

( * ) Notice: Subject to any disclaimer, the term of this patent is extended or adjusted under 35 U.S.C. 154(b) by 62 days.

(21) Appl. No.: 10/765,697

(22) Filed: Jan. 26, 2004

(65) Prior Publication Data

US 2005/0073268 A1 Apr. 7, 2005

Related U.S. Application Data

(60) Provisional application No. 60/508,715, filed on Oct. 2, 2003.

(51) Int. Cl.[7] .................................................. H03K 5/22
(52) U.S. Cl. .............................. 327/66; 327/67; 327/68; 315/158; 315/291
(58) Field of Search .............................. 372/66, 67, 68, 372/65, 63, 64, 50; 319/291, 307, 158, 159, 149

(56) References Cited

U.S. PATENT DOCUMENTS 5,982,201 A * 11/1999 Brokaw et al. ................ 327/53
6,424,204 B2 * 7/2002 Gul et al. .................... 327/538
6,661,817 B1 * 12/2003 Ames et al. ........... 372/29.021

* cited by examiner

Primary Examiner—Tuyet Thi Vo
(74) Attorney, Agent, or Firm—Bever, Hoffman & Harms, LLP; Patrick T. Bever

(57) ABSTRACT

A drive device for a light-emitting component including a reference source, which generates a current specification signal specifying a desired current through the light-emitting component, a current mirror circuit, which generates a current equal to a fraction of the actual current through the light-emitting component, and a regulating device having a first input and a second input, the first input being connected to the current mirror circuit and the second input being connected to the reference source. In this case, the regulating device generates a regulation signal that regulates the current through the light-emitting component in such a way that the deviation between the desired current and the actual current becomes minimal.

20 Claims, 3 Drawing Sheets

DRIVE DEVICE FOR A LIGHT-EMITTING COMPONENT

RELATED APPLICATION

The present application claims priority of U.S. patent application Ser. No. 60/508,715 filed by Karl Schrodinger and Jurgen Blank on Oct. 2, 2003.

FIELD OF THE INVENTION

The invention relates to a drive device for a light-emitting component. It is used in particular in a laser regulating module.

BACKGROUND OF THE INVENTION

It is known, in drive devices for light-emitting components, to use light detectors, for example monitor photodiodes, which measure the light power of the light-emitting component. The measured light power is compared with a desired light power in a regulating device. Depending on the difference between these light power values, a regulation signal that regulates the light power of the light-emitting component is generated in such a way that the deviation between the desired light power and the measured light power becomes minimal. In particular, the setting of a bias current through the light-emitting component is effected in this way.

The use of light detectors is disadvantageously associated with costs for the provision of the detectors and their integration into the drive device. Moreover, light detectors often have inherent measurement errors. By way of example, so-called "monitor tracking errors" arise in monitor photodiodes integrated in laser diodes. These "monitor tracking errors" are based on temperature-dependent inaccuracies or measurement errors of the monitor diode, which should actually correctly measure the coupled-in optical power of the laser diode.

OBJECT OF THE INVENTION

The present invention is based on the object of providing a drive device for a light-emitting component which manages without a light detector.

SUMMARY OF THE INVENTION

The present invention provides a drive device for a light-emitting component, the drive device having: a reference source, which generates a current specification signal specifying a desired current through the light-emitting component, a current mirror circuit, which generates a current equal to a fraction of the actual current through the light-emitting component, and a regulating device having a first input and a second input, the first input being connected to the current mirror circuit and the second input being connected to the reference source. The regulating device generates a regulation signal that regulates the current through the light-emitting component in such a way that the deviation between the desired current and the actual current becomes minimal.

The solution according to the invention is based on the concept of replacing a monitor diode by a current mirror circuit which mirrors a fraction of the current through the light-emitting component back to one input of the regulating device. The current mirror circuit may be realized by an additional circuit for the customary circuit parts of a drive circuit for light regulation without having to modify the existing circuit parts. It can therefore be realized in a simple and cost-effective manner.

In this case, the current mirror circuit provides an electrical feedback which maps the current through the light-emitting component with a factor onto one input of the regulating device. In this way, the current for the light-emitting component and thus at constant temperature the light power of the component can be regulated in a constant manner even without a monitor diode.

In a preferred refinement of the invention, the current mirror circuit has a first transistor, which generates a current proportional to the current through the light-emitting component. Furthermore, the current mirror circuit has a second and a third transistor, which form the actual current mirror. The current mirror has a reference current and a load current, the reference current being formed by the current generated by the first transistor and the load current being fed to the first input of the regulating device.

In order to provide a current through the first transistor that is proportional to the current through the light-emitting component, provision is preferably made for the control terminal of the first transistor to be connected to the output of the regulating device. Likewise connected to the output of the regulating device is the control terminal of a further transistor, which provides the current through the light-emitting component. The current through the first transistor and the current through the further transistor thus have a temperature-independent fixed factor. In this case, the control terminal is the base terminal in the case of bipolar transistors and the gate terminal in the case of field-effect transistors.

In a preferred refinement, the current mirror circuit has:

a first NPN transistor, the base terminal of which is connected to the regulating device and the emitter terminal of which is grounded, a first PNP transistor, the base terminal and the collector terminal of which are connected to the collector terminal of the first NPN transistor and the emitter terminal of which is connected to a positive supply voltage if appropriate via a resistor, and a second PNP transistor, the base terminal of which is connected to the base terminal of the first PNP transistor, the emitter terminal of which is connected to the positive supply voltage if appropriate via a resistor and the collector terminal of which is connected to the first input of the regulating device.

NPN transistors may be replaced by n-channel MOS transistors and PNP transistors may be replaced by p-channel MOS transistors.

It may be provided that the current mirror circuit has an additional switch, which can connect or disconnect a current of the current mirror circuit which is present at the first input of the regulating device. The switch may be designed as a MOS transistor, for example.

It is pointed out that the present invention provides a direct regulation of the current through the laser diode. The light power is not regulated since it is not detected directly. However, at constant temperature, the light power is unambiguously defined by the laser current. In the event of temperature changes, by contrast, the light power of the laser diode changes given a fixed laser current. In order to achieve a constant light power, the laser current must therefore be changed in the event of temperature changes. This is possible without measurement of the light power and the direct regulation thereof when the temperature dependence of the laser diode is known, so that the laser current required for a desired light power at a specific temperature is known.

The control of the laser current in the event of changing temperatures may be effected on the one hand by changing the current specification signal, generated by the reference source, in a manner dependent on the temperature present. On the other hand, the mirror factor of the current mirror circuit may be changed in a manner dependent on the temperature. In the first case, the desired value is changed in a temperature-dependent manner, and in the second case the feedback of the current regulation, as a result of which a changed current through the laser diode is generated, the changed current having the effect that the light power of the laser diode remains constant despite the change in temperature.

In a preferred refinement of the invention, the current mirror circuit is accordingly designed in a temperature-dependent manner, i.e. the mirror factor of the current mirror circuit changes with temperature. In this case, the current mirror circuit feeds a temperature-dependent current to the first input of the regulating device, which current completely or partially simulates the known temperature response of the light-emitting component.

In order to realize a temperature dependence, the current mirror circuit has two resistors, for example, which have different temperature dependencies. In particular, the resistors respectively arranged between an emitter terminal of a PNP transistor of the current mirror and the supply voltage have different temperature dependencies.

In a development of this refinement, provision is made for the current mirror circuit additionally to have circuit means which permit connection and disconnection of further resistors in order to be able to generate different temperature dependencies. In this way, the current mirror circuit can be used in conjunction with different light-emitting components which have different known temperature dependencies. Depending on the light-emitting component used, an altered temperature dependence of the current mirror voltage is produced by connection or disconnection of a resistor.

In this case, the further resistors are connected in parallel for example with a resistor arranged between the emitter terminal of one of the PNP transistors and the supply voltage.

In a further preferred refinement, the drive device additionally has a correction device, which compensates for a temperature-dictated error of the current mirror circuit by modifying in a temperature-dependent manner the current specification signal generated by the reference source. Such a correction device is disclosed in the pending U.S. patent application of Jul. 3, 2003 by the inventor Karl Schrödinger, entitled "Drive Device for a Light-emitting Component", the content of which is incorporated by reference into the present application.

In a further refinement of the invention, the drive device additionally has a monitor diode, which can be connected to the first input of the regulating device. For this case, changeover means are provided, which feed either an output signal of the monitor diode or an output signal of the current mirror circuit to the first input of the regulating device. A simple changeover between the regulation by means of a monitor diode and a direct current control can be effected in this way.

BRIEF DESCRIPTION OF THE DRAWINGS

The invention is explained in more detail below using an exemplary embodiment with reference to the figures, in which.

DESCRIPTION OF A PREFERRED EXEMPLARY EMBODIMENT

Figure 1:
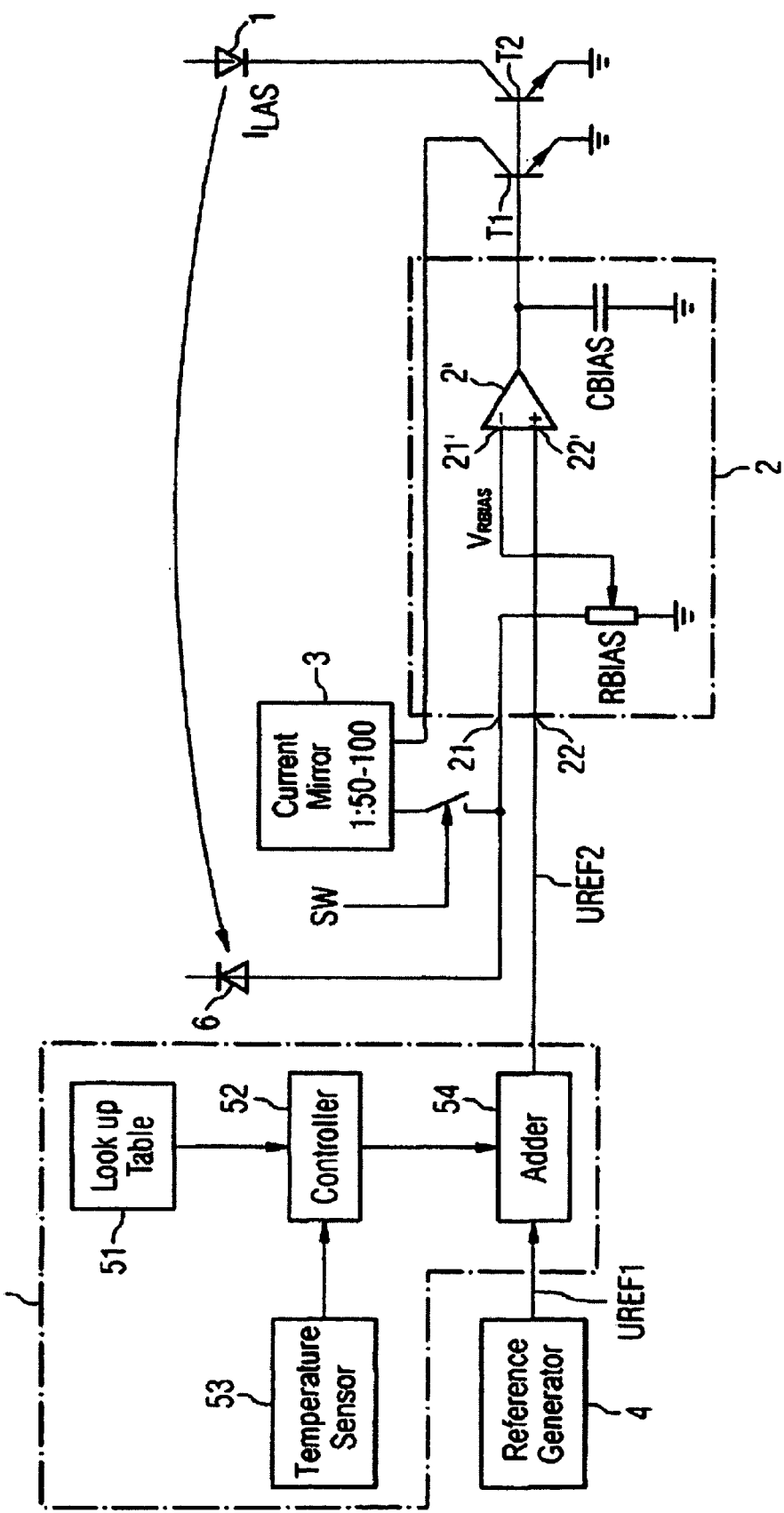
FIG. 1 shows an exemplary embodiment of a drive device for a laser with a diagrammatically illustrated current mirror circuit.

FIG. 1 shows the basic elements of a drive device for a laser diode 1. The drive device has a reference generator (source) 4, which generates a specification signal UREF1 specifying a desired current through the laser diode 1.

The signal UREF1 is modified by a correction device 5 and, after modification, fed as signal UREF2 to an input 22 of a regulating device 2. A further input 21 of the regulating device 2 is fed a signal which is proportional to the current $I_{LAS}$ flowing through the laser diode 1. The regulating device 2 generates a regulation signal that controls the current $I_{LAS}$ through the laser diode 1.

In order to generate a regulation signal for the laser current $I_{LAS}$, the regulating device 2 has an operational amplifier 2', the "inverting" input 21' of which is connected to the input 21 of the regulating device via a variable resistor RBIAS. A voltage $V_{RBIAS}$ proportional to the current fed into the input 21 of the regulating device 2 is thus present at the inverting input 21' of the operational amplifier 2'. In this case, by means of the variable resistor RBIAS, the laser current $I_{LAS}$ can be preset "by hand" or in user-specific fashion.

The "noninverting" input 22' of the operational amplifier 2' is connected to one input 22 of the regulating device 2, so that the modified specification signal UREF2 is applied to it.

The regulating device 2 or the operational amplifier 2' is connected, on the output side, to a base terminal of a control transistor T2, which generates the current $I_{LAS}$ through the laser diode 1. In this case, the emitter terminal of the control transistor T2 is grounded, while the collector terminal forms the terminal for the laser diode 1. The output of the operational amplifier 2' has a current output, for example, in which case, together with a capacitance CBIAS, an integrator circuit is produced which carries out an averaging of the signal fed to the input 21. However, a differently configured integrator circuit may also be used.

It is pointed out that the drive device illustrated in FIG. 1 sets the DC BIAS current through the laser diode 1. In addition, a modulation current modulated in accordance with a data sequence to be transmitted is applied to the laser diode 1, for which purpose additional circuit elements which are known per se and are not illustrated here are provided. The current $I_{LAS}$ is thus equal to the DC BIAS current through the laser diode 1.

The task of the regulating device 2 consists in setting the laser current $I_{LAS}$ for the laser diode 1, taking account of the signals present at the two inputs 21, 22, in such a way that the deviation between the actual current and the desired current specified by the modified specification signal UREF2 becomes minimal.

In order to provide a signal proportional to the actual current $I_{LAS}$ through the laser diode 1 at the input 21 of the regulating device, it is known to provide a monitor diode 6, which detects a fraction of the light emitted by the laser diode 1. In this case, the current through the monitor diode 6 that is fed to the input 21 of the regulating device 2 is proportional to the light power of the laser diode 1, which is in turn proportional to the current $I_{LAS}$ flowing through the laser diode.

Provision is now made for using, instead of or in supplementation of a monitor diode 6, a current mirror circuit with a current mirror 3 and a further transistor T1, the base of which is likewise connected to the output of the regulating device 2. This is explained in more detail below with reference to the exemplary embodiment of FIG. 2.

The current mirror circuit 30 has the NPN transistor T1, the base terminal of which is connected to the output of the regulating device 2 and the emitter terminal of which is grounded. The actual current mirror is formed from two PNP transistors T3, T4, the base terminal and the collector terminal of one PNP transistor T3 being connected to the collector terminal of the NPN transistor T1. The emitter terminal of the PNP transistor T3 is connected to a positive supply voltage $V_{CC}$ via a resistor R1.

The base terminal of the second PNP transistor T4 is connected to the base terminal of the first PNP transistor T3. The emitter terminal is connected to the positive supply voltage via a second resistor R2 and the collector terminal is connected to the first input 21 of the regulating device 2.

Accordingly, the base-emitter voltage of the two PNP transistors T3, T4 is adapted to one another, which precisely constitutes the particular feature of a mirror circuit.

The collector terminal of the PNP transistor T4 is connected to one input 21 of the regulating device via a switch SW formed as MOS transistor T5 in the exemplary embodiment illustrated. The use of the switch SW is optional and enables the mirror circuit to be alternatively switched in or switched out.

Changeover means 7 are furthermore provided, which feed either a signal of the monitor diode 6 or the signal present at the collector terminal of the transistor T4 to the input 21 of the regulating device 2. A changeover between a regulation by means of a monitor diode 6 and a regulation by means of a current mirror circuit is made possible in this way. If provision is made for completely dispensing with a monitor diode 6, the changeover means 7 are obviated and the collector terminal of the transistor T4 is then connected to one input 21 of the regulating device 2 via the switch SW or directly.

The method of operation of the current mirror circuit is as follows. The laser diode 1 is controlled by the current $I_{LAS}$ generated by the control transistor T2. In parallel with this, the transistor T1, the base terminal of which is likewise connected to the output of the regulating device 2, generates a current $I_{LAS*}$ proportional to the current $I_{LAS}$. The current generated by the transistor T1 represents the reference current of the current mirror with the transistors T3, T4. The current mirror then generates a current $I_{LAS**}$, which is fed to one input of the regulating device 2 via the switch SW. Thus, via the current mirror, a fraction of the current $I_{LAS}$ through the laser diode 1 is mirrored back to one input of the regulating device 2. This effects a current regulation which keeps the current through the laser diode 1 constant. The current mirror circuit 30 provides an electrical feedback to one input of the regulating device 2, which is indicated by an arrow.

Depending on the choice of the transistors T3, T4 and resistors R1, R2 used, the current $I_{LAS**}$ fed to one input of the regulating device 2 may be equal to the current $I_{LAS*}$ through the transistor T1 or represent a fraction of the current $I_{LAS*}$. The current $I_{LAS*}$ through the transistor T1 represents a fraction of the current $I_{LAS}$ through the laser 1, so that overall—and that is a matter of significance—the current mirror circuit 30 provides a current which represents a fraction of the current through the laser diode 1. Preferably, a current which is equal to $\frac{1}{50}$ to $\frac{1}{100}$ of the current through the laser diode is fed to the input 21 of the regulating device 2.

It is now known that laser diodes have a temperature dependence, which has the effect that the light power of a laser diode decreases with increasing temperature given a constant current.

Figure 3:
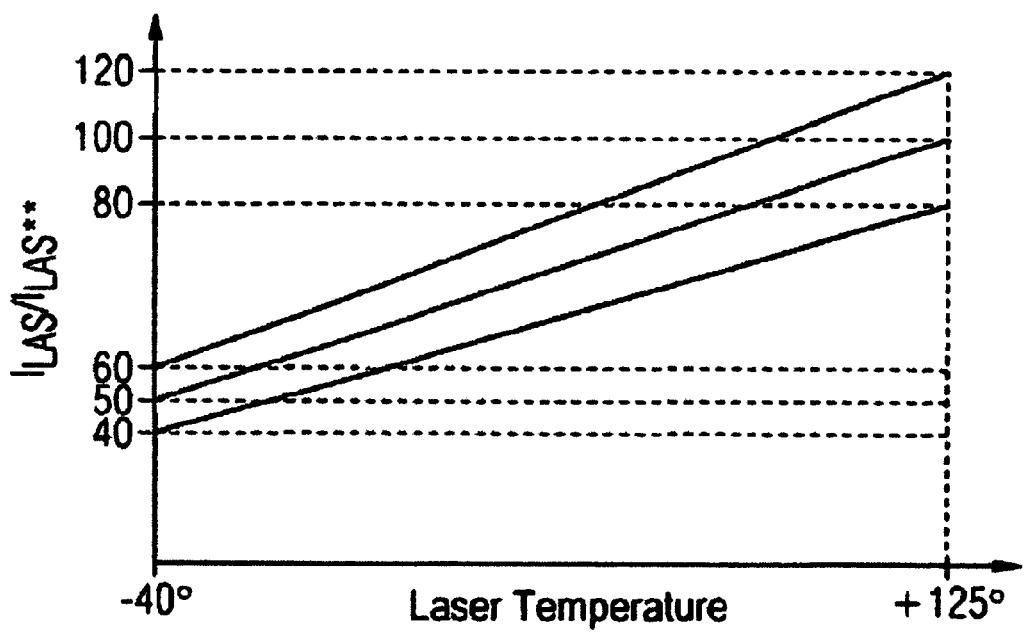
FIG. 3 shows the ratio of the current through the laser diode to the current generated by the current mirror circuit as a function of the laser temperature in the case of the drive device of FIGS. 1 and 2.

A preferred refinement of the drive device described provides for the current $I_{LAS}$ likewise to have a temperature dependence in order to simulate the temperature response of the laser diode 1 used. Such a temperature response is illustrated in FIG. 3. It can be seen that the quotient of the current $I_{LAS}$ through the laser diode 1 with respect to the current $I_{LAS}$ at the collector output of the transistor T4 increases with increasing temperature. The current $I_{LAS}$ through the laser diode thus increases with increasing temperature. The illustration shows three curves for three different lasers.

In order to generate such a temperature dependence, it may be provided that the two resistors R1, R2 have different temperature dependencies through the current mirror circuit 30. The different temperature dependencies of the resistors R1, R2 result in a desired temperature response of the output current $I_{LAS**}$, which is completely or partially simulated on the temperature response of the laser diode 1. The latter is known, so that it is possible to simulate the temperature response.

Without a temperature dependence of the current mirror circuit 30, the latter would always feed a constant current to one input 21 of the regulating device 2. The current through the laser diode 1 would likewise be constant, so that the light power of the laser diode 1 would decrease at increasing temperatures. Corresponding to the temperature response of the current $I_{LAS}$ is the fact that, at increasing temperature, a smaller fraction of the current $I_{LAS}$ through the laser diode 1 is mirrored to the input 21 of the regulating device, that is to say the mirror factor of the current mirror circuit changes. However, a smaller input signal at the input 21 of the regulating device 2 ensures that the regulating device 2 generates a changed output control signal that leads to a larger current $I_{LAS}$ through the laser diode 1, so that $I_{LAS}$ is kept constant. The light power of the laser diode 1 can thus be kept constant.

Figure 4:
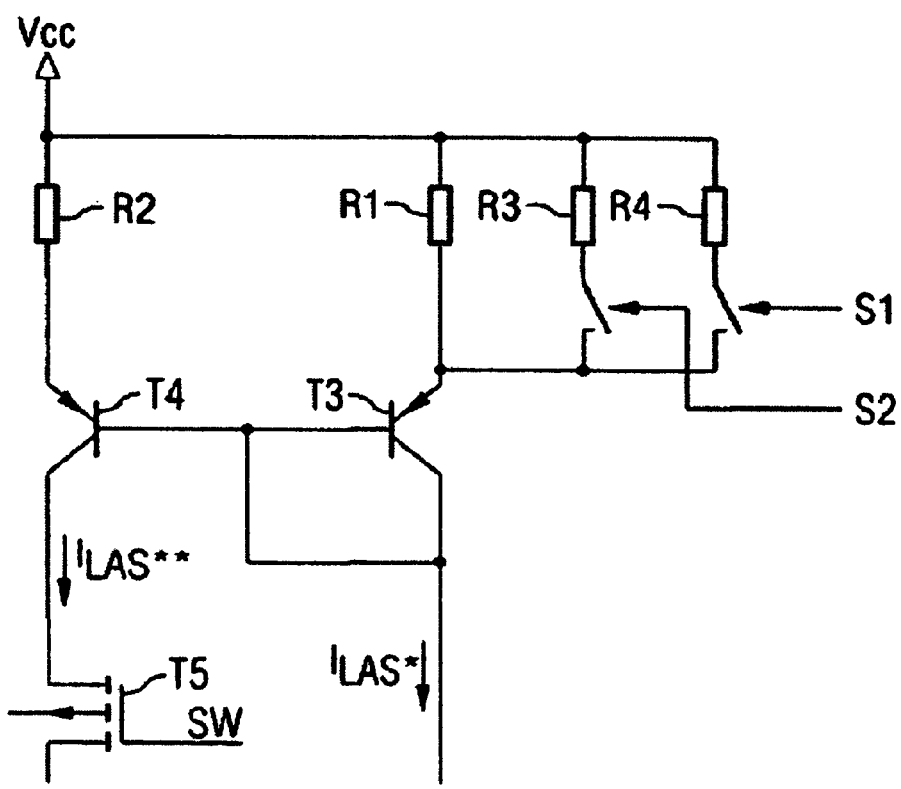
FIG. 4 shows an alternative configuration of the current mirror circuit of FIG. 2, in which a plurality of resistors can be connected by switches.

FIG. 4 shows a circuit variation in which there is a changeover possibility in the current mirror. Thus, two resistors R3, R4, which can be connected by switches S1, S2, are connected in parallel with the resistor R1 between the emitter terminal T3 and the supply voltage $V_{CC}$. In this way, it is possible to simulate different temperature dependencies, for instance when using different laser diodes 1. For the rest, the circuit of FIG. 4 corresponds to the current mirror circuit of FIG. 2.

Moreover, a simulation of the temperature dependence of the laser diode 1 may also be effected by means of the correction device 5 mentioned with regard to FIG. 1, to be precise in supplementation of or as an alternative to a simulation of the temperature dependence by the current mirror circuit. In the former case, the correction device preferably performs a fine adjustment of the temperature dependence which has already been simulated to an approximation by the analog temperature-dependent current mirror circuit. Such a fine adjustment is expedient if the temperature response is reproduced inadequately or incorrectly by the current mirror circuit. In the second case, a temperature dependence of the current $I_{LAS^{**}}$ of the current mirror circuit is dispensed with and the complete temperature control is effected by means of the correction device 5.

Figure 2:
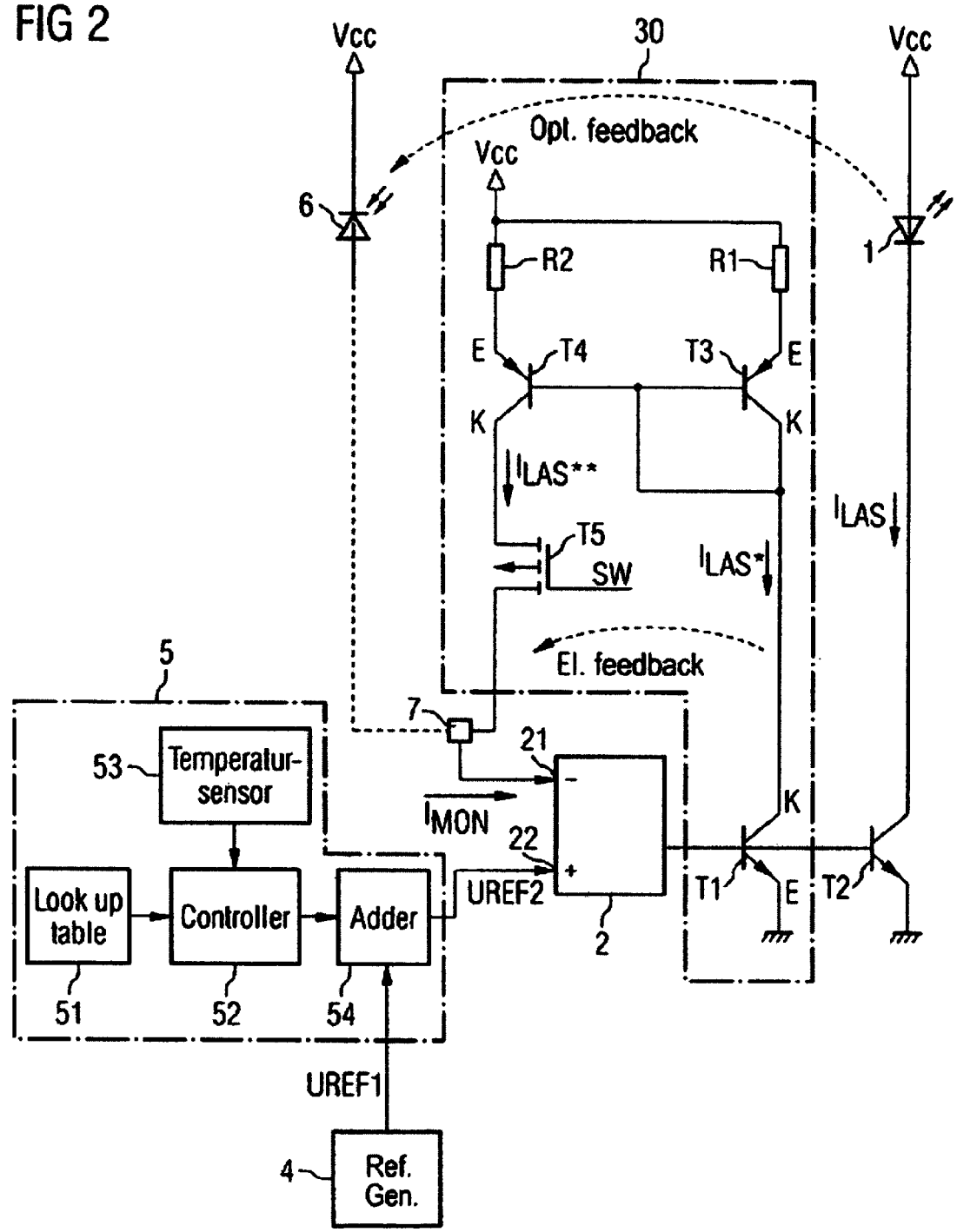
FIG. 2 shows a drive circuit in accordance with FIG. 1, illustrating an exemplary embodiment for the current mirror circuit.

The correction device has, in accordance with FIGS. 1 and 2, an analog addition element (Adder) 54, a control device (Controller) 52, a freely programmable memory (RAM module) 51 and a temperature sensor 53. In this case, the function is as follows. The reference generator 4 generates a specification signal UREF1, which specifies the desired current or the desired light power of the laser diode 1. The specification signal UREF1 is modified by the correction device 5, the modified signal UREF2 being generated.

By means of the temperature sensor 53, the control device 52 measures the temperature present at the laser diode 1 or a temperature proportional thereto. Depending on the temperature value measured by the temperature sensor 53, the control device 52 reads from the memory 51 a matching correction value K(T) for the respective measured temperature value. For this purpose, correction values together with assigned temperature levels or temperature ranges are stored in a table form in the memory 51. This table forms a so-called "look-up table". The look-up table may contain "delta values" for example for one of various temperature levels, which delta values additively or subtractively modify the specification signal UREF1 of the reference source 4.

The look-up table may be constructed for example in such a way that the memory addresses of the memory cells of the memory 51 in each case correspond to a temperature or a measured temperature value T; the content of the memory cells then produces the assigned correction value K(T). The number of temperature levels results from the number of memory cells implemented and thus from the number of available address bits (e.g. 128 memory cells given 7 bits).

After the control device 52 has read the correction K(T) associated with the respective temperature value T from the memory 51, it transmits it to the analog addition element 54 via a D/A converter (not illustrated). The analog addition element 54 uses an analog modification signal to generate the modified specification signal UREF2 from the specification signal UREF1 present on the input side by addition.

In this way, a temperature adjustment can be effected as an alternative or in supplementation of a temperature adjustment by the current mirror circuit.

It is pointed out that the use of a correction device 5 is optional. The correction device can be dispensed with in particular when the current mirror circuit 30 already simulates the temperature response of the laser diode sufficiently correctly.

The configuration of the invention is not restricted to the exemplary embodiments presented above, which are to be understood merely by way of example. For example, all the NPN transistors may also be realized as p-channel MOS transistors, and vice versa. Equally, all the PNP transistors may also be realized as n-channel MOS transistors, and vice versa. The person skilled in the art recognizes that there exist numerous alternative embodiment variants which make use of the teaching defined in the claims below.

We claim:

1. A drive device for a light-emitting component comprising:
    a reference source, which generates a current specification signal specifying a desired current through the light-emitting component,
    a current mirror circuit, which generates a load current equal to a fraction of an actual current through the light-emitting component, and
    a regulating device having a first input and a second input, the first input being coupled to the current mirror circuit and the second input being coupled to the reference source, the regulating device generating a regulation signal that regulates the actual current through the light-emitting component in such a way that a difference between the desired current and the actual current is minimized.

2. The drive device as claimed in claim 1, further comprising a correction device, the correction device including means for compensating for a temperature-dictated error of the current mirror circuit by modifying in a temperature-dependent manner the current specification signal generated by the reference source.

3. The drive device as claimed in claim 1, further comprising a monitor diode and changeover means for selectively connecting the monitor diode to the first input of the regulating device, whereby the changeover means selectively passes one of the load signal of the current mirror circuit and an output signal of the monitor diode to the first input of the regulating device.

4. The drive device as claimed in claim 1, further comprising a switch for selectively connecting the load current generated by the current mirror circuit to the first input of the regulating device.

5. The drive device as claimed in claim 4, wherein the switch comprises a MOS transistor.

6. The drive device as claimed in claim 1, wherein the current mirror circuit includes means for feeding a temperature-dependent current to the first input of the regulating device in such a way that a temperature response of the light-emitting component is at least partially simulated.

7. The drive device as claimed in claim 6, wherein the current mirror circuit comprises at least first and second resistors which have different temperature dependencies.

8. The drive device as claimed in claim 7, the current mirror circuit having circuit means for selectively connecting further resistors for the purpose of generating different temperature dependencies.

9. The drive device as claimed in claim 1, wherein the current mirror circuit comprises:
    a first transistor, which generates a mirror current that is proportional to the actual current through the light-emitting component, and
    a current mirror comprising a second transistor and a third transistor respectively generating a reference current and said load current, the reference current of the current mirror being formed by the mirror current generated by the first transistor, and the load current of the current mirror being fed to the first input of the regulating device.

10. The drive device as claimed in claim 9,
    wherein the actual current through the light-emitting component is provided by a control transistor,
    wherein the control terminal of the control transistor is connected to an output of the regulating device, and wherein the control terminal of the first transistor of the current mirror circuit is also connected to the output of the regulating device.

11. The drive device as claimed in claim 9, wherein the current mirror circuit comprises:
   a NPN transistor, the base terminal of which is connected to the regulating device and the emitter terminal of which is grounded,
   a first PNP transistor, the base terminal and the collector terminal of which are connected to the collector terminal of the first NPN transistor and the emitter terminal of which is connected to a positive supply voltage, and
   a second PNP transistor, the base terminal of which is connected to the base terminal of the first PNP transistor, the emitter terminal of which is connected to the positive supply voltage and the collector terminal of which is connected to the first input (21) of the regulating device.

12. The drive device as claimed in claim 11, wherein the emitter terminals of the first and second PNP transistors are respectively connected to the positive supply voltage via first and second resistors, the first and second resistors having different temperature dependencies.

13. The drive device as claimed in claim 12, wherein the further resistors are selectively connected in parallel by the circuit means, with at least one resistor arranged between the emitter terminal of one of the first and second PNP transistors and the supply voltage.

14. A drive device for a controlling an actual current transmitted through a light-emitting component, the drive device comprising:
   a control transistor connected in series with the light-emitting component between a high voltage source and a low voltage source;
   a reference source for generating a current specification signal corresponding to a desired current to be transmitted through the light-emitting component;
   a current mirror circuit, connected between the high voltage source and the low voltage source, for generating a load current that is equal to a portion of the actual current transmitted through the light-emitting component; and
   a regulating device having a first input terminal connected to receive the current specification signal, a second input terminal connected to receive the load current generated by the current mirror circuit, and an output terminal connected to a control terminal of the control transistor,
   wherein the regulating device includes means for generating a regulation signal on the output terminal based on a difference between the load current and the current specification signal.

15. The drive device of claim 14, wherein the regulating device comprises an operational amplifier.

16. The drive device of claim 14, wherein the current mirror circuit comprises:
   a first transistor having an emitter connected to the low voltage source, and a control terminal connected to the output terminal of the regulating device; and
   a current mirror including:
      a second transistor having an emitter connected to the high voltage source, the second transistor also having a collector and a control terminal connected to a collector of the first transistor, and
      a third transistor having an emitter connected to the high voltage source, a collector connected to the first input terminal of the regulating device, and a control terminal connected to the collector of the first transistor.

17. The drive device of claim 16, wherein the current mirror further comprises:
   a first resistor connected between the high voltage source and the collector of the second transistor; and
   a second resistor connected between the high voltage source and the collector of the third transistor,
   wherein the first and second resistors have different temperature dependencies.

18. A drive device for a controlling an actual current transmitted through a light-emitting component, the drive device comprising:
   a control transistor connected in series with the light-emitting component between a high voltage source and a low voltage source;
   means for generating a current specification signal corresponding to a desired current to be transmitted through the light-emitting component;
   a current mirror circuit comprising:
      a first transistor having an emitter connected to the low voltage source, and a control terminal connected to the output terminal of the regulating device; and
      a current mirror including:
         a second transistor having an emitter connected to the high voltage source, the second transistor also having a collector and a control terminal connected to a collector of the first transistor, and
         a third transistor having an emitter connected to the high voltage source, and a control terminal connected to the collector of the first transistor; and
   means for generating a regulation signal based on a difference between a load current transmitted from a collector of the third transistor and the current specification signal, wherein the regulation signal is transmitted to a control terminal of the control transistor.

19. The drive device of claim 18, wherein the current mirror further comprises:
   a first resistor connected between the high voltage source and the emitter of the second transistor; and
   a second resistor connected between the high voltage source and the emitter of the third transistor,
   wherein the first and second resistors have different temperature dependencies.

20. The drive device of claim 18, wherein said means for generating the current specification signal comprises a reference generator for generating a first signal, and a correction device for generating the current specification signal by selectively modifying the first signal using a temperature-dependent value.

* * * * *